(12) United States Patent
Kaigawa et al.

(10) Patent No.: US 8,541,102 B2
(45) Date of Patent: *Sep. 24, 2013

(54) (LI, NA, K, BI)(NB, TA)O3 BASED PIEZOELECTRIC MATERIAL AND MANUFACTURING METHOD OF THE SAME

(75) Inventors: Kazuyuki Kaigawa, Kitanagoya (JP); Ritsu Tanaka, Nagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 925 days.

This patent is subject to a terminal disclaimer.

(21) Appl. No.: 12/495,830

(22) Filed: Jul. 1, 2009

(65) Prior Publication Data

US 2010/0021728 A1      Jan. 28, 2010

(30) Foreign Application Priority Data

Jul. 28, 2008 (JP) ................................ 2008-192944

(51) Int. Cl.
*B32B 5/16* (2006.01)
*H01L 41/18* (2006.01)

(52) U.S. Cl.
USPC ...................................... 428/338; 252/62.9 R

(58) Field of Classification Search
None
See application file for complete search history.

(56) References Cited

U.S. PATENT DOCUMENTS

| 6,419,848 | B1 * | 7/2002 | Qiu et al. ................... 252/62.9 R |
| 7,893,601 | B2 * | 2/2011 | Kaigawa et al. ............... 310/358 |
| 2004/0058797 | A1 | 3/2004 | Nonoyama et al. | |
| 2006/0006360 | A1 | 1/2006 | Takao et al. | |
| 2009/0072673 | A1 * | 3/2009 | Fujii et al. ...................... 310/358 |
| 2009/0121589 | A1 * | 5/2009 | Kaigawa et al. ............... 310/358 |

FOREIGN PATENT DOCUMENTS

| EP | 1 939 951 A1 | 7/2008 |
| EP | 2 060 547 A2 | 5/2009 |
| JP | 05155652 A * | 6/1993 |
| JP | 2001-240471 A1 | 9/2001 |
| JP | 2004-244300 A1 | 9/2004 |
| JP | 2005-281013 | 10/2005 |
| JP | 2006-028001 A1 | 2/2006 |
| JP | 2007-204336 A | 8/2007 |

OTHER PUBLICATIONS

U.S. Appl. No. 12/343,689, filed Dec. 24, 2008, Kaigawa et al.
Masato Matsubara, et al., "*Effect of Li Substitution on the Piezoelectric Properties of Potassium Sodium Niobate Ceramics*," Japanese Journal of Applied Physics, vol. 44, No. 8, 2005, pp. 6136-6142.
Evelyn Hollenstein, et al., "*Piezoelectric Properties of Li- and Ta-Modified $(K_{0.5}Na_{0.5})NbO_3$ Ceramics*," Applied Physics Letters, 87, 182905 (2005), pp. 182905-1 to 182905-3.
Yiping Guo, et al., "*Phase Transitional Behavior and Piezoelectric Properties of $(Na_{0.5}K_{0.5})NbO_3$-$LiNbO_3$ Ceramics*," Applied Physics Letters, vol. 85, No. 18, Nov. 1, 2004, pp. 4121-4123.
Yasuyoshi Saito, et al., "*Lead-Free Piezoceramics*," Nature, 432, 2004, pp. 84-87.
Yuhua Zhen, et al., "*Normal Sintering of $(K,Na)NbO_3$ Based Ceramics: Influence of Sintering Temperature on Densification, Microstructure, and Electrical Properties*," Journal of the American Ceramic Society, vol. 89, No. 12, Dec. 1, 2006, pp. 3669-3675.
Liu Daijun, et al., "*Effects of Bismuth Oxide-Doping on Properties of Potassium Sodium Niobate Lead-Free Piezoelectric Ceramics*," Journal of the Chinese Ceramic Society, vol. 35, No. 9, Sep. 2007, pp. 1141-1145, *Abstract*.
Liu Daijun, et al., "*Effects of $Bi_2O_3$-Doping on the Properties of $(Na_{0.5}K_{0.5})NbO_3$ Lead-Free Piezoelectric Ceramics*," Rare Metal Materials and Engineering, vol. 36, Aug. 2007, pp. 452-455, *Abstract*.
Fangfang Wang, et al., "*Preparation and Characterization of Lead-Free Niobate-Tantalate Piezoelectric Ceramics*," Applications of Ferroelectrics, 2007, ISAF 2007, Sixteenth IEEE International Symposium, May 1, 2007, pp. 696-699.
Liu Daijun, et al., "*Effect of Heating Rate on the Structure Evolution of $(K_{0.5}Na_{0.5})NbO_3$ $LiNbO_3$ Lead-Free Piezoelectric Ceramics*," Journal of Electroceramics, vol. 20, No. 2, Dec. 11, 2007, pp. 107-111.
Japanese Office Action, dated Mar. 13, 2012 (2 pages).
Extended European Search Report and Written Opinion mailed Jan. 23, 2012 (16 pages).
Yuhua Zhen et al., "*Abnormal Grain Growth and New Core-Shell Structure in $(K,Na)NbO_3$-Based Lead-Free Piezoelectric Ceramics*," Journal of the American Ceramic Society, vol. 90, No. 11, Sep. 17, 2007, pp. 3496-3502.
Japanese Office Action dated Jan. 8, 2013.

* cited by examiner

*Primary Examiner* — Monique Jackson
(74) *Attorney, Agent, or Firm* — Burr & Brown

(57) ABSTRACT

Piezoelectric materials having improved electrical properties, and manufacturing methods of the same, are provided. In (Li, Na, K, Bi)(Nb, Ta)O3 based piezoelectric materials, the surface microstructures of sintered bodies include microscopic grains having grain diameters of less than 5 μm, intermediate grains having grain diameters of 5 μm or more and less than 15 μm, and coarse grains having grain diameters of 15 μm or more and 100 μm or less.

10 Claims, 4 Drawing Sheets

EXAMPLE 2(FIRE KEEPING CONDITIONS:850°C×5 HOURS)

COMPARATIVE EXAMPLE 1(FIRE KEEPING WAS NOT PERFORMED)

(LI, NA, K, BI)(NB, TA)O3 BASED PIEZOELECTRIC MATERIAL AND MANUFACTURING METHOD OF THE SAME

FIELD OF THE INVENTION

The present invention relates to (Li, Na, K)(Nb, Ta)$O_3$ based piezoelectric materials used for actuators or sensors and manufacturing methods thereof.

BACKGROUND OF THE INVENTION

A piezoelectric/electrostrictive actuator has an advantage that displacement can precisely be controlled in the order of submicrons. Especially, in the piezoelectric/electrostrictive actuator in which a sintered body of a piezoelectric/electrostrictive porcelain composition is used as a piezoelectric/electrostrictive body, in addition to the advantage that the displacement can precisely be controlled, there are other advantages that the actuator has high electromechanical change efficiency, large generative force, high responsivity, high durability and small power consumption, and the actuator using these advantages is employed in a head of an ink jet printer, an injector of a diesel engine or the like.

As the piezoelectric/electrostrictive porcelain composition for the piezoelectric/electrostrictive actuator, heretofore, a Pb(Zr, Ti)$O_3$ (PZT)-type piezoelectric/electro-strictive porcelain composition has been used, but there has been a strong fear of an influence of solute of lead from the sintered body on global environments, and hence an (Li, Na, K)(Nb, Ta)$O_3$ type piezoelectric/electrostrictive porcelain composition has been investigated.

An (Li, Na, K)(Nb, Ta)$O_3$ type piezoelectric material is usually sintered in the air or an oxygen atmosphere at 1020 to 1250° C. for 0.15 to 4 hours (e.g., Non-Patent Documents 1 to 3). A heating rate to reach a firing temperature is 200° C./h or 300° C./h, and the temperature rises at a constant heating rate from room temperature to the firing temperature (e.g., Patent Document 1).

There is also a research example in which the temperature is kept in a range of 600 to 650° C. for 1 to 5 hours in the heating process, whereby an organic binder added to improve formability of powder is removed (a de-binder process) (e.g., Patent Document 1). Microstructure of the sintered body includes grains of around 10 μm (e.g., Non-Patent Document 1). Moreover, there is a study example aimed at orientation structure of the sintered body (e.g., Non-Patent Document 4).

[Non-Patent Document 1] M. Matsubara et al., Japanese Journal of Applied Physics 44 (2005) pp. 6136-6142.
[Non-Patent Document 2] E. Hollenstein et al., Applied Physics Letters 87 (2005) 182905
[Non-Patent Document 3] Y. Guo et al., Applied Physics Letters 85 (2004) 4121
[Patent Document 1] JP-A-2006-028001
[Non-Patent Document 4] Y. Saito et al., Nature 432, 84-87 (2004)

PROBLEM TO BE SOLVED BY THE INVENTION

Conventionally, study has been conducted aiming at a microstructure or orientation structure having small and uniform grain diameter for the purpose of improving electrical properties. However, it is still hard to say that sufficient electrical properties such as electric-field-induced strain are obtained and piezoelectric materials in which the electrical properties are further improved are in demand.

SUMMARY OF THE INVENTION

The purpose of the present invention is to provide piezoelectric materials in which electrical properties are further improved and manufacturing methods thereof.

The present inventors have found that (Li, Na, K, Bi)(Nb, Ta)$O_3$ based piezoelectric materials can be prepared to solve the above problems, the materials being constituted of the surface microstructures of sintered bodies including microscopic grains, intermediate grains and coarse grains having grain diameters in predetermined ranges, respectively. That is, according to the present invention, piezoelectric materials and manufacturing methods of the same are provided as follows.

According to a first aspect of the present invention, an (Li, Na, K, Bi)(Nb, Ta)$O_3$ based piezoelectric material is provided in which the surface microstructure of a sintered body is constituted of microscopic grains having grain diameters of less than 5 μm, intermediate grains having grain diameters of 5 μm or more and less than 15 μm, and coarse grains having grain diameters of 15 μm or more and 100 μm or less.

According to a second aspect of the present invention the (Li, Na, K, Bi)(Nb, Ta)$O_3$ based piezoelectric material according to the first aspect is provided, which includes 10 to 60% of the microscopic grains and 1% or more of the coarse grains in a share of grains in terms of area.

According to a third aspect of the present invention the (Li, Na, K, Bi)(Nb, Ta)$O_3$ based piezoelectric material according to first or second aspects is provided, which is represented by a composition formula:

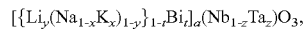

wherein $1.00 \leq a \leq 1.10$, $0.20 \leq x \leq 0.80$, $0.02 \leq y \leq 0.20$, $0.00 \leq z \leq 0.50$, and $0.0000 < t < 0.0100$.

According to a fourth aspect of the present invention, the (Li, Na, K, Bi)(Nb, Ta)$O_3$ based piezoelectric material according to first or second aspects is provided, which is represented by a composition formula:

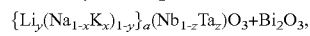

wherein $1.00 \leq a \leq 1.10$, $0.20 \leq x \leq 0.80$, $0.02 \leq y \leq 0.20$, $0.00 \leq z \leq 0.50$, and the amount of $Bi_2O_3$ to be added is larger than 0.00 mol % and smaller than 0.5 mol %.

According to a fifth aspect of the present invention the (Li, Na, K, Bi)(Nb, Ta)$O_3$ based piezoelectric material according to any one of first to fourth aspects is provided, wherein a ratio c/a obtained by diffraction angles which are middle points of full width at half maximum of diffraction line profiles is larger, and a temperature $T(\in_{max})$ at which a dielectric constant is maximum shifts to a low temperature side, as compared with the sintered body which has the same constituent elements and the same composition ratio and which does not include the coarse grains having grain diameters of 15 μm or more and 100 μm or less.

According to a sixth aspect of the present invention, the (Li, Na, K, Bi)(Nb, Ta)$O_3$ based piezoelectric material according to any one of first to fifth aspects is provided, which contains at least one metal element selected from the group consisting of Mn, Cr, Fe, Co, Ni, Cu and Zn.

According to a seventh aspect of the present invention, a manufacturing method of an (Li, Na, K, Bi)(Nb, Ta)$O_3$ based piezoelectric material is provided, comprising the steps of:

mixing compounds containing metal elements so as to be a composition represented by (Li, Na, K, Bi)(Nb, Ta)$O_3$, calcining the resultant mixture, followed by grinding to obtain calcined/crushed powder; and sintering the calcined/crushed powder at a firing temperature so that a heat area in a range of 800 to 900° C. during a heating process in a firing curve is in a range of 800 to 20000 [° C.×h.].

According to an eighth aspect of the present invention, a manufacturing method of an (Li, Na, K, Bi)(Nb, Ta)O$_3$ based piezoelectric material is provided, comprising the steps of:

mixing compounds containing metal elements so as to be a composition represented by (Li, Na, K, Bi)(Nb, Ta)O$_3$, calcining the resultant mixture, followed by grinding to obtain calcined/crushed powder;

performing a constant temperature keeping process of keeping the powder at a constant temperature in a range of 800 to 900° C. for a constant time during the heating process in a firing curve; and further raising the temperature to sinter the powder at a firing temperature.

According to a ninth aspect of the present invention, the manufacturing method of the (Li, Na, K, Bi)(Nb, Ta)O$_3$ based piezoelectric material according to the seventh or eighth aspects is provided, further comprising the steps of:

adding, to the calcined/crushed powder, at least one metal element selected from the group consisting of Mn, Cr, Fe, Co, Ni, Cu and Zn; and then firing to sinter the powder.

In the (Li, Na, K, Bi)(Nb, Ta)O$_3$ based piezoelectric material of the present invention, the surface microstructure of the sintered body of the material is constituted of the microscopic grains having grain diameters less than 5 µm, the intermediate grains having grain diameters of 5 µm or more and less than 15 µm, and the coarse grains having grain diameters of 15 µm or more and 100 µm or less, whereby as compared with a conventional example, electrical properties such as an electric-field-induced strain, a relative dielectric constant, a piezoelectric constant and a dielectric loss are improved.

Moreover, according to the manufacturing method of the present invention, when the calcined/crushed powder is fired, the heat area in the range of 800 to 900° C. during the heating process in the firing curve (time-temperature curve) is set to a range of 800 to 20000 [° C.×h.], or this constant temperature keeping process which temperature is kept constantly in the range of 800 to 900° C. for the constant time is inserted during the heating process in the firing curve. In consequence, it is possible to obtain the (Li, Na, K, Bi)(Nb, Ta)O$_3$ based piezoelectric material in which the surface microstructure of the sintered body is constituted of the microscopic grains, the intermediate grains and the coarse grains, and electrical properties such as the electric-field-induced strain, the relative dielectric constant, the piezoelectric constant and the dielectric loss are improved.

DETAILED DESCRIPTION OF THE INVENTION

Figure 1:
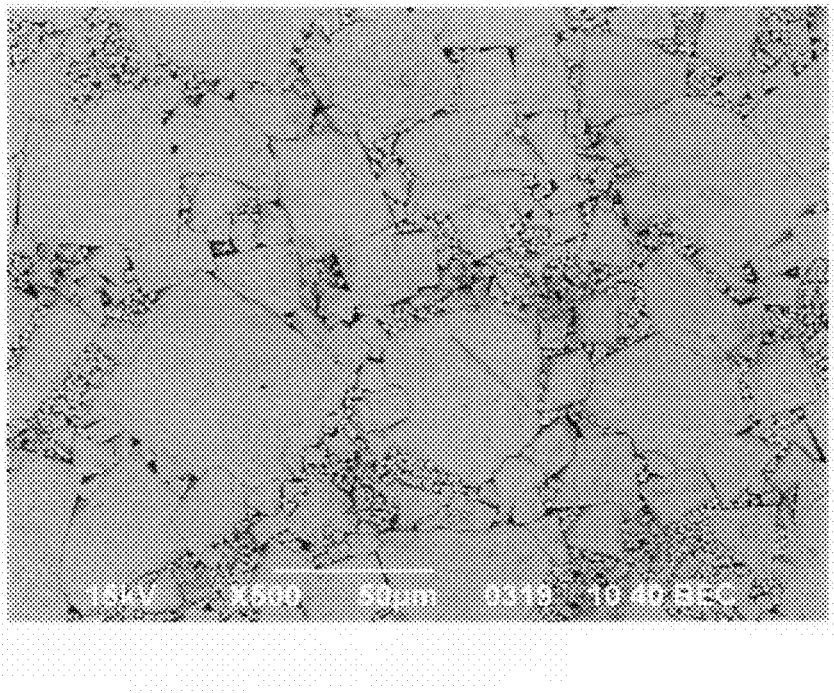
FIG. 1 is an SEM photograph showing a surface microstructure of Example 2.

Hereinafter, the present invention will be described with reference to specific embodiments, but the present invention is not limited to these embodiments when interpreted, and the present invention can variously be changed, modified or improved based on the knowledge of any person skilled in the art without departing from the scope of the present invention.

In (Li, Na, K, Bi)(Nb, Ta)O$_3$ based piezoelectric materials of the present invention, the surface microstructure of a sintered body is constituted of microscopic grains having grain diameters of less than 5 µm, intermediate grains having grain diameters of 5 µm or more and less than 15 µm, and coarse grains having grain diameters of 15 µm or more and 100 µm or less. Here, the grain diameters are the corresponding diameters of circles having an equal area, that is, the diameters of the circles each having an area equal to that of each grain when the surface of the sintered body is observed by an SEM or the like. Specifically, it is preferable to include 10 to 60% of the microscopic grains and 1% or more of the coarse grains in the share in terms of area.

Moreover, the (Li, Na, K, Bi)(Nb, Ta)O$_3$ based piezoelectric material of the present invention has a perovskite structure in which an A site includes ions of at least one selected from the group consisting of Li, Na, K and Bi and in which a B site includes ions of at least one selected from the group consisting of Nb and Ta.

Further specific examples of the piezoelectric material include a material represented by the following composition formula (1) or (2) (in the material represented by the following composition formula (2), the amount of Bi$_2$O$_3$ to be added is larger than 0.00 mol % and smaller than 0.5 mol %).

Composition Formula:

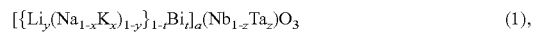

$$[\{Li_y(Na_{1-x}K_x)_{1-y}\}_{1-t}Bi_t]_a(Nb_{1-z}Ta_z)O_3 \quad (1),$$

wherein $1.00 \leq a \leq 1.10$, $0.20 \leq x \leq 0.80$, $0.02 \leq y \leq 0.20$, $0.00 \leq z \leq 0.50$, and $0.0000 < t < 0.0100$.

Composition Formula:

$$\{Li_y(Na_{1-x}K_x)_{1-y}\}_a(Nb_{1-z}Ta_z)O_3 + Bi_2O_3 \quad (2),$$

wherein $1.00 \leq a \leq 1.10$, $0.20 \leq x \leq 0.80$, $0.02 \leq y \leq 0.20$ and $0.00 \leq z \leq 0.50$.

It is to be noted that the composition of the piezoelectric material (the crushed powder of the sintered body) can be analyzed as follows. The amount of Li and Bi can be quantified by wet analysis method. Calibration curves are prepared by use of standard samples having varied composition ratios, and then the amount of Na, K, Nb and Ta can be quantified.

In the above composition formula (1) or (2), an A/B ratio is set to $a \leq 1.10$. This is because above this range, a dielectric loss tends to increase, and an electric-field-induced strain during application of a high electric field tends to decrease. The increase of the dielectric loss causes a large problem in a piezoelectric/electrostrictive porcelain composition for an actuator to which the high electric field is applied. On the other hand, the ratio is set to $1.00 \leq a$ so as to promote the grain growth and densify the material. Below this range, heating to 1100° C. or more is required for promoting the grain growth. In this case, alkali components easily evaporate, the composition fluctuates, and hence properties become unstable.

In the above composition formula (1), the amount of Bi to be substituted is set to $0.0000 < t < 0.0100$. This is because in this range, it is possible to increase the electric-field-induced strain during application of the high electric field without largely fluctuating a tetragonal-orthorhombic phase transition temperature $T_{OT}$ at which piezoelectric/electrostrictive properties are high. This effect is especially noticeable when the amount of Bi to be substituted is set to $0.0002 \leq t \leq 0.0010$. The amount of Bi to be substituted is set to $t<0.0100$. This is because above this range, the dielectric loss tends to increase, and the electric-field-induced strain during application of the high electric field tends to decrease.

It is to be noted that Bi may be contained by substitution as represented by the above composition formula (1), or by addition as represented by the above composition formula (2), but the amount of Bi to be substituted or added in terms of atoms is preferably larger than 0.00 mol % and smaller than 1 mol %, and especially preferably 0.02 to 0.10 mol %.

In the above composition formula (1) or (2), the amounts of K, Li and Ta are set to $0.20 \leq x \leq 0.80$, $0.02 \leq y \leq 0.20$ and $0.00 \leq z \leq 0.50$, respectively, because in this range, the piezoelectric/electrostrictive porcelain composition suitable for the actuator can be obtained. When, for example, x is below this range, the piezoelectric/electrostrictive properties immediately deteriorate. On the other hand, when x exceeds this range, it becomes difficult to sinter the material, and a firing temperature has to be raised. It is not desirable to raise the firing temperature. This is because when the firing temperature is raised, alkali components included in the piezoelectric/electrostrictive porcelain composition evaporate, and the piezoelectric/electrostrictive properties cannot stably be obtained. Moreover, when y is below this range, it also becomes difficult to sinter the material, and the firing temperature has to be raised. On the other hand, when y exceeds this range, the precipitation of hetero-phases increases, and insulation properties deteriorate. Furthermore, when z exceeds this range, it also becomes difficult to sinter the material, and the firing temperature has to be raised.

Moreover, the (Li, Na, K, Bi)(Nb, Ta)$O_3$ based piezoelectric material of the present invention preferably contains at least one metal element selected from the group consisting of Mn, Cr, Fe, Co, Ni, Cu and Zn. These elements are transition metal elements or typical metal elements, and belong to any one of the groups VI to XII of the fourth period which have similar chemical properties. When the elements are incorporated in a grain boundary phase, the melting point of the grain boundary phase is lowered, and the coarse grains are grown. These elements may be contained as oxides or the like in not only the grain boundary phase but also the grains or the hetero-phases. It is preferable that these metal elements as sub-components are contained in a manner that content thereof is 3 mol % or less with respect to 100 mol % of perovskite oxide in terms of metal atoms. The content is set to 3 mol % or less, because above this range, the dielectric loss tends to increase, and the electric-field-induced strain during application of the high electric field tends to decrease.

Next, a manufacturing method of the (Li, Na, K, Bi)(Nb, Ta)$O_3$ based piezoelectric material of the present invention will be described. First, raw material powder (calcined/crushed powder) is synthesized. Chemical compounds containing each of metal elements are weighed, respectively, so as to satisfy the ratio (the mol ratio) of each metal element in the composition of the raw material powder, and then the chemical compounds are mixed with solvent such as ethanol by a mix method such as ball milling to obtain mixture of slurry. It is to be noted that there is not any special restriction on the types of the chemical compounds containing each of the metal elements. Oxides, carbonates, tartrates or the like of each metal element are preferably used, and, for example, lithium carbonate, potassium tartrate, sodium tartrate, bismuth oxide, niobium oxide or tantalum oxide can be used.

The resultant mixed slurry is dried by using a drier or performing an operation such as filtering. The mixture is calcined and then crushed. Crushing can be performed by a process such as ball milling. Thus, the material powder (calcined/crushed powder) is manufactured.

It is preferable that an average grain diameter of the raw material powder which is the calcined/crushed powder is between 0.1 μm and 1 μm. Here, the average grain diameter is 50% diameter (median diameter) in cumulative distribution.

It is preferable that at least one metal element selected from the group consisting of Mn, Cr, Fe, Co, Ni, Cu and Zn is added to the (Li, Na, K, Bi)(Nb, Ta)$O_3$ calcined/crushed powder. This calcined/crushed powder is formed into pellets and then the pellets are sintered.

The pellet-like calcined/crushed powder is sintered in the following firing curves (time-temperature curve). A heat area in a range of 800 to 900° C. during the heating process that the temperature is raised up to the firing temperature is determined to be in a range of 800 to 20000 [° C.×h.]. Alternatively, a constant temperature keeping process in the range of 800 to 900° C. for a constant time is performed during the heating process, the temperature is further raised, and then the powder is sintered at the firing temperature.

Here, "the heat area in the range of 800 to 900° C. during the heating process" is an area (unit: [° C.×h.]) between the ordinate (a temperature axis) and the abscissa (a time axis) in the range of 800 to 900° C. during the heating process in a graph of a firing curve (a time-temperature curve) in which the ordinate indicates the temperature (° C.) and the abscissa indicates the time (h) Specifically, for example, a hatched part of the graph of the firing curve shown in each of FIGS. 3A to 3E is "the heat area in the range of 800 to 900° C. during the heating process".

Figure 3A:
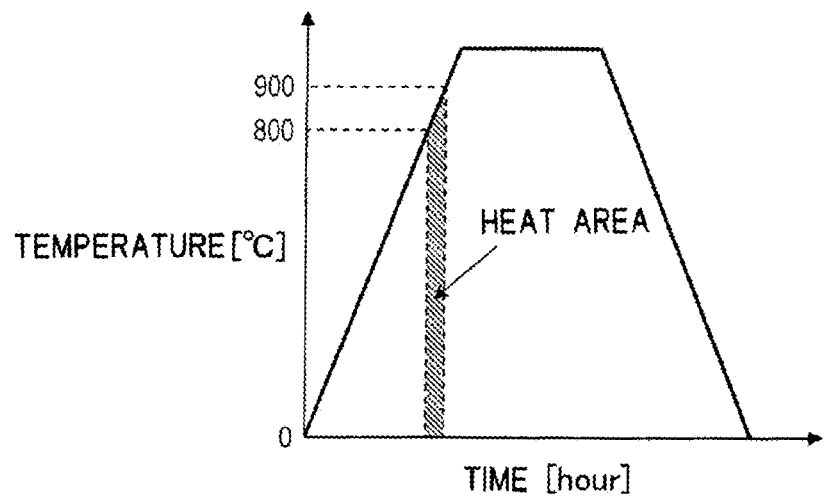
FIG. 3A is a graph of a firing curve showing a heat area in a range of 800 to 900° C. during the heating process.
Figure 3B:
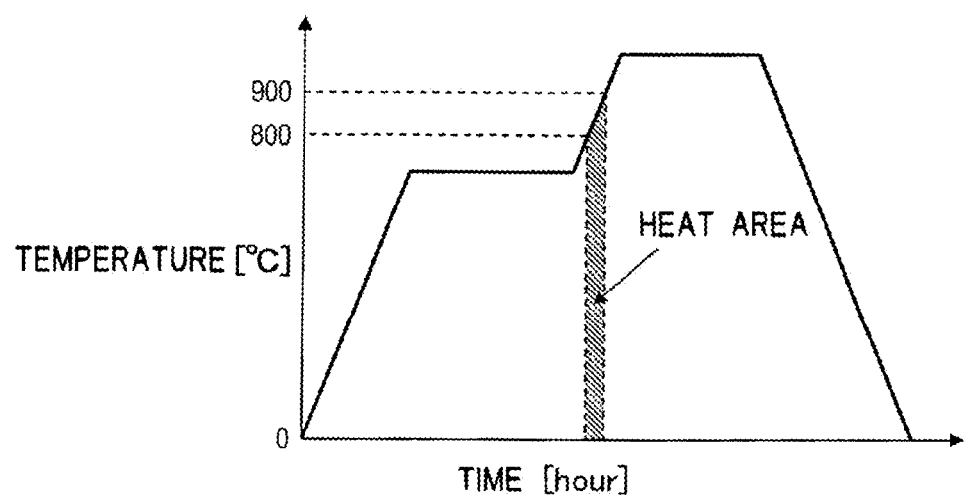
FIG. 3B is a graph of the firing curve showing a heat area in a range of 800 to 900° C. during the heating process.
Figure 3C:
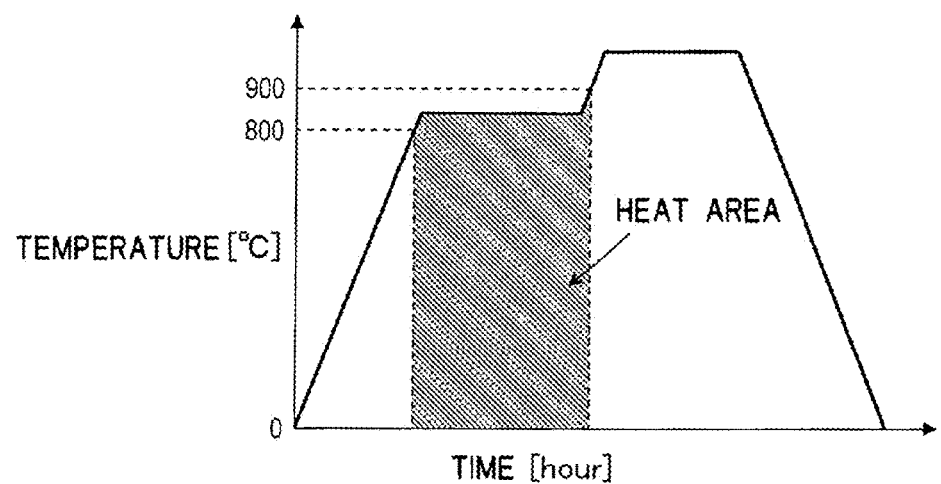
FIG. 3C is a graph of the firing curve showing a heat area in a range of 800 to 900° C. during the heating process.
Figure 3D:
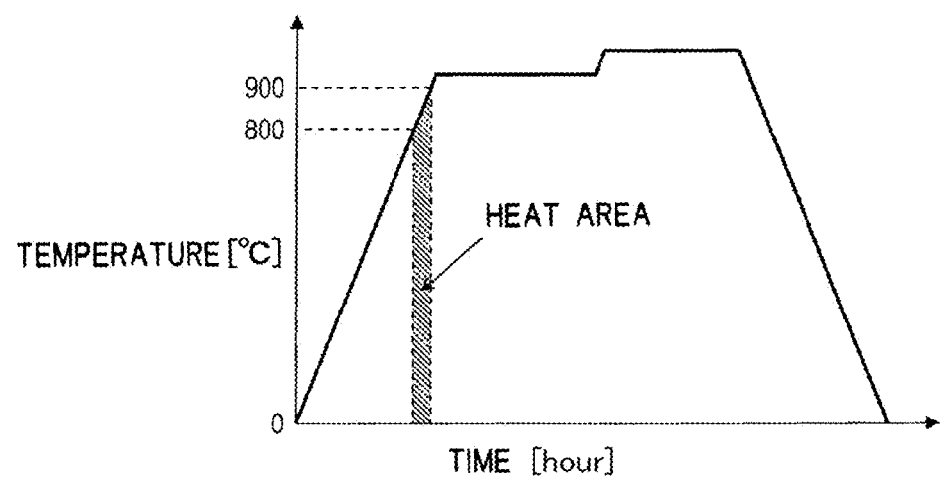
FIG. 3D is a graph of the firing curve showing a heat area in a range of 800 to 900° C. during the heating process.
Figure 3E:
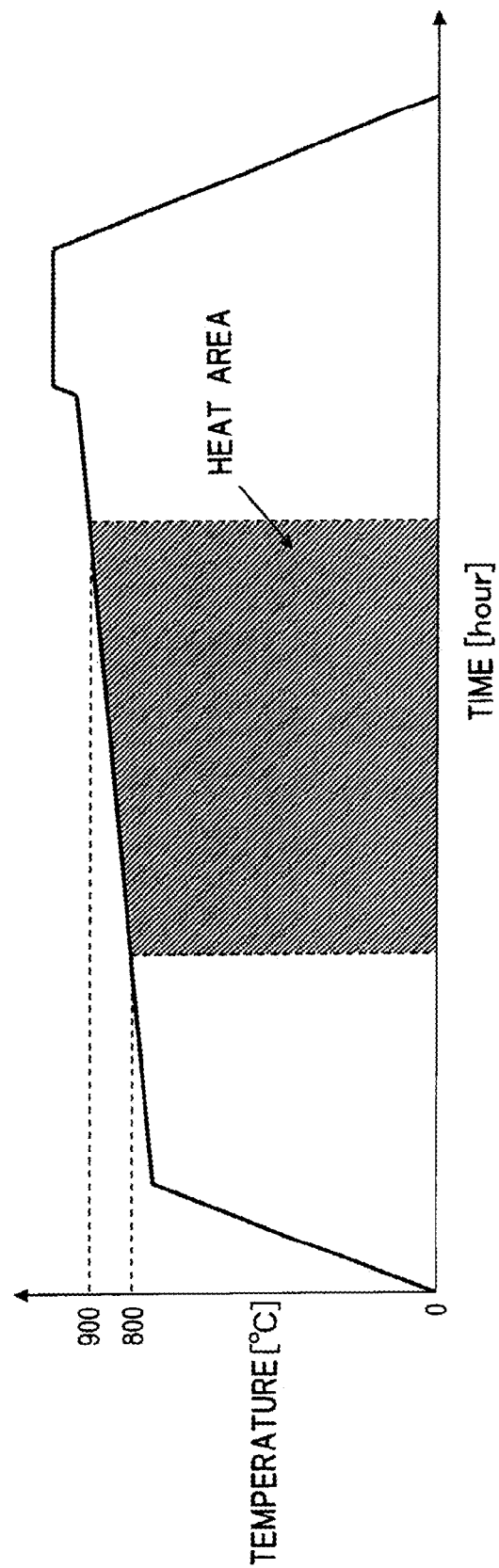
FIG. 3E is a graph of the firing curve showing a heat area in a range of 800 to 900° C. during the heating process.

It is to be noted that in these drawings, FIG. 3A shows an example of the firing curve in a case where the constant temperature keeping process of keeping the powder at the constant temperature for the constant time is not provided during the heating process to the firing temperature (the maximum temperature) at which the calcined/fired powder is sintered. FIG. 3B shows an example of the firing curve in a case where the keeping temperature in the constant temperature keeping process is less than 800° C. FIG. 3C shows an example of the firing curve in a case where the keeping temperature in the constant temperature keeping process is in the range of 800 to 900° C. FIG. 3D shows an example of the firing curve in a case where the keeping temperature in the constant temperature keeping process is higher than 900° C. FIG. 3E shows an example of the firing curve in a case where any constant temperature keeping process is not provided but the heating rate during the heating process is decreased.

In a case where the powder is fired so that the heat area in the range of 800 to 900° C. during the heating process is 800 to 20000 [° C.×h.], the ratio of the microscopic grains having grain diameters less than 5 μm decreases, and the ratio of the coarse grains having grain diameters of 15 μm or more increases, whereby as described above, it is possible to obtain the (Li, Na, K, Bi)(Nb, Ta)$O_3$ based piezoelectric material sintered body having a surface microstructure constituted of microscopic grains having grain diameters less than 5 μm, intermediate grains having grain diameters of 5 μm or more and less than 15 μm, and coarse grains having grain diameters of 15 μm or more and 100 μm or less. In the sintered body, electrical properties such as the electric-field-induced strain, the relative dielectric constant, the piezoelectric constant and the dielectric loss are improved. When this heat area is less than 800 [° C.×h.], the grains insufficiently grow, and the electrical properties are not sufficiently improved. On the other hand, when the heat area is more than 20000 [° C.×h.], the coarse grains become excessively large, the hetero-phases gather in the grain boundary, and eventually the dielectric loss increases.

Moreover, even when the constant temperature keeping process of keeping the powder at the constant temperature in the range of 800 to 900° C. for the constant time is performed during the heating process, the ratio of the microscopic grains having grain diameters less than 5 μm decreases, and the ratio of the coarse grains having grain diameters of 15 μm or more increases, whereby as described above, it is possible to obtain the (Li, Na, K, Bi)(Nb, Ta)$O_3$ based piezoelectric material sintered body having a surface microstructure constituted of microscopic grains having grain diameters less than 5 μm, intermediate grains having grain diameters of 5 μm or more and less than 15 μm, and coarse grains having grain diameters of 15 μm or more and 100 μm or less. In the sintered body, electrical properties such as the electric-field-induced strain, the relative dielectric constant, the piezoelectric constant and the dielectric loss are improved. The constant temperature in the constant temperature keeping process is preferably set to a range of 840 to 860° C. Moreover, the constant time for keeping the powder at this constant temperature is preferably set to a range of 0.5 to 20 hours.

It is to be noted that a reason why the electrical properties of the sintered body obtained by such a manufacturing method are improved is supposedly that an internal stress is induced to the sintered body. Moreover, in an (Li, Na, K, Bi)(Nb, Ta)$O_3$ composition system, the ratio of the microscopic grains having grain diameters less than 5 μm decreases, and the ratio of the coarse grains having grain diameters of 15 μm or more and 100 μm or less increases as described above, whereby as compared with a sintered body which does not have any coarse grain (which has the same constituent elements and the same composition ratio), a ratio c/a between a c-axis and an a-axis obtained by diffraction angles which are middle points of full width at half maximum of diffraction line profiles increases, and a temperature $T(\in_{max})$ at which a dielectric constant is maximum shifts to a low temperature side.

After firing, the resultant sintered body is machined into an appropriate shape (e.g., a strip shape) as required, subjected to a polarization treatment and used as the piezoelectric materials. The polarization treatment is performed by applying a voltage of about 5 kV/mm to the piezoelectric materials for 15 minutes or more.

EXAMPLES

Hereinafter, the present invention will be described in accordance with examples in more detail, but the present invention is not limited to these examples.

Comparative Example 1

Figure 2:
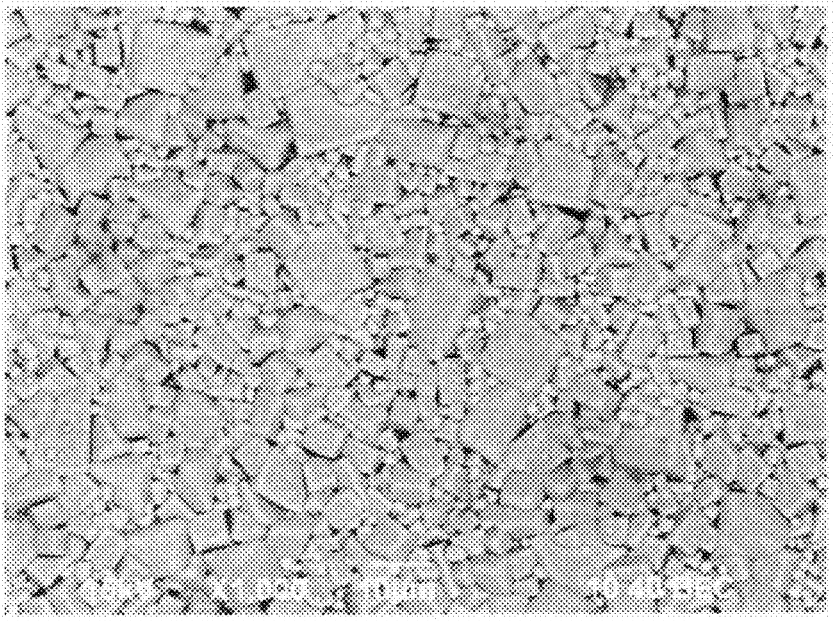
FIG. 2 is an SEM photograph showing a surface microstructure of Comparative Example 1.

Calcined/crushed powder having a composition of [{Li$_y$(Na$_{1-x}$K$_x$)$_{1-y}$}$_{1-t}$Bi$_t$]$_a$(Nb$_{1-z}$Ta$_z$)$O_3$ (x=0.450, y=0.060, z=0.082, a=1.01 and t=0.0005)+0.05 mol % of $MnO_2$ (particle diameters: 0.2 to 0.5 μm, particle shape: spherical) was formed into a pellet (a pellet-like sample). This pellet-like sample was heated up to a firing temperature of 970° C. at a heating rate of 200° C./h in the air. The sample was held at 970° C. for 3 hours, and then cooled to room temperature at a cooling rate of 200° C./h. An X-ray diffraction profile of the surface of a sintered body obtained in this manner was measured, and a ratio c/a (tetragonality) between a c-axis and an a-axis was calculated using diffraction angles which were middle points of full width at half maximum of diffraction line profiles. Moreover, a microstructure of the surface of the sintered body was observed by a scanning electron microscope (SEM). Moreover, a bulk density was measured by Archimedes method. Furthermore, a grain diameter distribution based on the corresponding diameter of a circle having an equal area was analyzed from the surface microstructure (see an SEM photograph of FIG. 2) of the resultant sintered body by using the ordinate as a standard for determining the share of grains in terms of area. Next, the sintered body was machined into strips, and then thermally treated at 900° C. for one hour in the air, whereby a machining stress was removed, a temperature $T(\in_{max})$ at which a dielectric constant during the heating process was maximum was evaluated. Subsequently, a polarization treatment was performed on conditions of 5 kV/mm×15 min (room temperature) in silicon oil held at 25° C., and electrical properties (a relative dielectric constant $\in$, a piezoelectric constant $d_{31}$, a dielectric loss tan δ, an electric-field-induced strain S4000, etc.) were evaluated. It is to be noted that the term "S4000" means the amount of strain in 31 direction (the direction vertical to an electric field applying direction) at a time when an electric field of 4 kV/mm was applied. These results are shown in Tables 1 and 6. Moreover, the tables also show a heat area in a range of 800 to 900° C. during the heating process when the pellet-like sample was fired.

Comparative Example 2

After the pellet-like sample described in Comparative Example 1 was heated up to a temperature of 750° C. at a heating rate of 200° C./h in the air, and kept at 750° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 1. Moreover, the table also shows a heat area in a range of 800 to 900° C. during the heating process when the pellet-like sample was fired.

Example 1

After the pellet-like sample described in Comparative Example 1 was heated up to a temperature of 800° C. at a heating rate of 200° C./h in the air, and kept at 800° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 1. Moreover, the table also shows a heat area in a range of 800 to 900° C. during the heating process when the pellet-like sample was fired.

Example 2

After the pellet-like sample described in Comparative Example 1 was heated up to a temperature of 850° C. at a heating rate of 200° C./h in the air, and kept at 850° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure (see an SEM photograph of FIG. 1) of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Tables 1 and 6. Moreover, the tables also show a heat area in a range of 800 to 900° C. during the heating process when the pellet-like sample was fired.

Example 3

After the pellet-like sample described in Comparative Example 1 was heated up to a temperature of 900° C. at a heating rate of 200° C./h in the air, and kept at 900° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 1. Moreover, the table also shows a heat area in a range of 800 to 900° C. during the heating process when the pellet-like sample was fired.

Comparative Example 3

After the pellet-like sample described in Comparative Example 1 was heated up to a temperature of 950° C. at a heating rate of 200° C./h in the air, and kept at 950° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 1. Moreover, the table also shows a heat area in a range of 800 to 900° C. during the heating process when the pellet-like sample was fired.

Comparative Example 4

Calcined/crushed powder having a composition of [{$Li_y$(Na$_{1-x}$K$_x$)$_{1-y}$}$_{1-t}$Bi$_t$]$_a$(Nb$_{1-z}$Ta$_z$)O$_3$ (x=0.450, y=0.060, z=0.082, a=1.01 and t=0.0002)+0.05 mol % of MnO$_2$ (particle diameters: 0.2 to 0.5 µm, particle shape: spherical) was formed into a pellet (a pellet-like sample). This pellet-like sample was heated up to a firing temperature of 970° C. at a heating rate of 200° C./h in the air. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Furthermore, the properties, crystal structure and microstructure of the resultant sintered body were evaluated in the same manner as in Comparative Example 1. These results are shown in Table 2. Moreover, the table also shows a heat area in a range of 800 to 900° C. during the heating process when the pellet-like sample was fired.

Example 4

After the pellet-like sample described in Comparative Example 4 was heated up to a temperature of 850° C. at a heating rate of 200° C./h in the air, and kept at 850° C. for 20 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 2. Moreover, the table also shows a heat area in a range of 800 to 900° C. during the heating process when the pellet-like sample was fired.

Comparative Example 5

Calcined/crushed powder having a composition of [{$Li_y$(Na$_{1-x}$K$_x$)$_{1-y}$}$_{1-t}$Bi$_t$]$_a$(Nb$_{1-z}$Ta$_z$)O$_3$ (x=0.450, y=0.060, z=0.082, a=1.01 and t=0.0010)+0.05 mol % of MnO$_2$ (particle diameters: 0.2 to 0.5 µm, particle shape: spherical) was formed into a pellet (a pellet-like sample). This pellet-like sample was heated up to a firing temperature of 970° C. at a heating rate of 200° C./h in the air. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Furthermore, the properties, crystal structure and microstructure of the resultant sintered body were evaluated in the same manner as in Comparative Example 1. These results are shown in Table 3.

Moreover, the table also shows a heat area in a range of 800 to 900° C. during the heating process when the pellet-like sample was fired.

Example 5

After the pellet-like sample described in Comparative Example 5 was heated up to a temperature of 850° C. at a heating rate of 200° C./h in the air, and kept at 850° C. for 0.5 hour, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 3. Moreover, the table also shows a heat area in a range of 800 to 900° C. during the heating process when the pellet-like sample was fired.

Example 6

After the pellet-like sample described in Comparative Example 5 was heated up to a temperature of 850° C. at a heating rate of 200° C./h in the air, and kept at 850° C. for 24 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 3. Moreover, the table also shows a heat area in a range of 800 to 900° C. during the heating process when the pellet-like sample was fired.

Comparative Example 6

Calcined/crushed powder having a composition of $[\{Li_y(Na_{1-x}K_x)_{1-y}\}_{1-t}Bi_t]_a(Nb_{1-z}Ta_z)O_3$ (x=0.450, y=0.060, z=0.082, a=1.00 and t=0.0005)+0.05 mol % of $MnO_2$ (particle diameters: 0.2 to 0.5 μm, particle shape: spherical) was formed into a pellet (a pellet-like sample). This pellet-like sample was heated up to a firing temperature of 970° C. at a heating rate of 200° C./h in the air. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Furthermore, the properties, crystal structure and microstructure of the resultant sintered body were evaluated in the same manner as in Comparative Example 1. These results are shown in Table 4. Moreover, the table also shows a heat area in a range of 800 to 900° C. during the heating process when the pellet-like sample was fired.

Example 7

After the pellet-like sample described in Comparative Example 6 was heated up to a temperature of 850° C. at a heating rate of 200° C./h in the air, and kept at 850° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 4. Moreover, the table also shows a heat area in a range of 800 to 900° C. during the heating process when the pellet-like sample was fired.

Comparative Example 7

Calcined/crushed powder having a composition of $[\{Li_y(Na_{1-x}K_x)_{1-y}\}_{1-t}Bi_t]_a(Nb_{1-z}Ta_z)O_3$ (x=0.450, y=0.060, z=0.082, a=1.10 and t=0.0005)+0.05 mol % of $MnO_2$ (particle diameters: 0.2 to 0.5 μm, particle shape: spherical) was formed into a pellet (a pellet-like sample). This pellet-like sample was heated up to a firing temperature of 970° C. at a heating rate of 200° C./h in the air. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Furthermore, the properties, crystal structure and microstructure of the resultant sintered body were evaluated in the same manner as in Comparative Example 1. These results are shown in Table 5. Moreover, the table also shows a heat area in a range of 800 to 900° C. during the heating process when the pellet-like sample was fired.

Example 8

After the pellet-like sample described in Comparative Example 7 was heated up to a temperature of 850° C. at a heating rate of 200° C./h in the air, and kept at 850° C. for 5 hours, and then the temperature was raised up to a firing temperature of 970° C. at a heating rate of 200° C./h. The sample was held at 970° C. for 3 hours, and then cooled to room temperature at a cooling rate of 200° C./h. A grain diameter distribution based on the corresponding diameter of a circle having an equal area was analyzed from the surface microstructure of the resultant sintered body by using the ordinate as the standard for determining the share of grains in terms of area. Moreover, the properties, crystal structure and microstructure of the resultant sintered body were evaluated in the same manner as in Comparative Example 1. These results are shown in Table 5. Moreover, the table also shows a heat area in a range of 800 to 900° C. during the heating process when the pellet-like sample was fired.

Example 9

A sintered body prepared by the procedure of Example 2 was machined into strips, and then subjected to a polarization treatment on conditions of 5 kV/mm×15 min (65° C.) in silicon oil, and electrical properties were evaluated. These results are shown in Table 6.

TABLE 1

Dependency on keeping temperature (the amount of Bi to be substituted: t = 0.0005, an A/B ratio: a = 1.01, keeping time: 5 hours)

| | | Comparative Example 1 | Comparative Example 2 | Example 1 | Example 2 | Example 3 | Comparative Example 3 |
|---|---|---|---|---|---|---|---|
| Keeping temperature [° C.] | | Keeping was not performed | 750 | 800 | 850 | 900 | 950 |
| Heat area [° C. × h.] | | 425 | 425 | 4425 | 4675 | 4925 | 425 |
| Bulk density [g/cm³] | | 4.432 | 4.433 | 4.441 | 4.496 | 4.490 | 4.388 |
| Relative dielectric constant | | 982 | 985 | 992 | 1141 | 991 | 960 |
| $d_{31}$ [pm/V] | | 97 | 97 | 98 | 107 | 99 | 92 |
| tan δ [%] | | 1.1 | 1.1 | 1.0 | 0.8 | 1.0 | 2.4 |
| S4000 [ppm] | | 615 | 615 | 630 | 705 | 630 | 590 |
| c/a | | 1.0199 | 1.0199 | 1.0204 | 1.0207 | 1.0205 | 1.0198 |
| T($\epsilon_{max}$) [° C.] | | 44 | 44 | 38 | 30 | 37 | 44 |
| Grain diameter distribution | Microscopic grains | 55% | 55% | 58% | 17% | 51% | 50% |
| | Intermediate grains | 45% | 45% | 41% | 2% | 46% | 50% |
| | Coarse grains | 0% | 0% | 1% | 81% | 3% | 0% |
| Maximum grain diameter [μm] | | Less than 15 | Less than 15 | 15 | 60 | 20 | Less than 15 |

TABLE 2

Dependency on keeping time (the amount of Bi to be substituted: t = 0.0002, an A/B ratio: a = 1.01, keeping temperature: 850° C.)

| | | Comparative Example 4 | Example 4 |
|---|---|---|---|
| Keeping time [h.] | | Keeping was not performed | 20 |
| Heat area [° C. × h.] | | 425 | 17425 |
| Bulk density [g/cm³] | | 4.433 | 4.520 |
| Relative dielectric constant | | 957 | 1083 |
| $d_{31}$ [pm/V] | | 90 | 93 |
| tan δ [%] | | 1.0 | 0.8 |
| S4000 [ppm] | | 600 | 630 |
| c/a | | 1.0203 | 1.0208 |
| T($\epsilon_{max}$) [° C.] | | 42 | 30 |
| Grain diameter distribution | Microscopic grains | 55% | 10% |
| | Intermediate grains | 45% | 5% |
| | Coarse grains | 0% | 85% |
| Maximum grain diameter [μm] | | Less than 15 | 90 |

TABLE 3

Dependency on keeping time (the amount of Bi to be substituted: t = 0.0010, an A/B ratio: a = 1.01, keeping temperature: 850° C.)

| | | Comparative Example 5 | Example 5 | Example 6 |
|---|---|---|---|---|
| Keeping time [h.] | | Keeping was not performed | 0.5 | 24 |
| Heat area [° C. × h.] | | 425 | 850 | 20825 |
| Bulk density [g/cm³] | | 4.424 | 4.470 | 4.383 |
| Relative dielectric constant | | 1028 | 1063 | 979 |
| $d_{31}$ [pm/V] | | 96 | 100 | 87 |
| tan δ [%] | | 1.2 | 1.0 | 1.2 |
| S4000 [ppm] | | 610 | 650 | 555 |
| c/a | | 1.0197 | 1.0200 | 1.0213 |
| T($\epsilon_{max}$) [° C.] | | 38 | 28 | 12 |
| Grain diameter distribution | Microscopic grains | 30% | 19% | 14% |
| | Intermediate grains | 70% | 40% | 1% |
| | Coarse grains | 0% | 41% | 85% |
| Maximum grain diameter [μm] | | Less than 15 | 50 | 150 |

TABLE 4

Effect of constant temperature keeping process (the amount of Bi to be substituted: t = 0.0005, an A/B ratio: a = 1.00)

| | | Comparative Example 6 | Example 7 |
|---|---|---|---|
| Constant temperature keeping conditions | | Keeping was not performed | 850° C. × 5 h |
| Heat area [° C. × h.] | | 425 | 4675 |
| Bulk density [g/cm³] | | 4.400 | 4.432 |
| Relative dielectric constant | | 1007 | 1050 |
| $d_{31}$ [pm/V] | | 92 | 95 |
| tan δ [%] | | 1.0 | 1.0 |
| S4000 [ppm] | | 580 | 600 |
| c/a | | 1.0204 | 1.0207 |
| T($\epsilon_{max}$) [° C.] | | 14 | 10 |
| Grain diamter distribution | Microscopic grains | 60% | 55% |
| | Intermediate grains | 30% | 44% |
| | Coarse grains | 0% | 1% |

TABLE 4-continued

Effect of constant temperature keeping process
(the amount of Bi to be substituted: t = 0.0005,
an A/B ratio: a = 1.00)

| | Comparative Example 6 | Example 7 |
|---|---|---|
| Maximum grain diameter [μm] | Less than 15 | 15 |

TABLE 5

Effect of constant temperature keeping process
(the amount of Bi to be substituted: t = 0.0005,
an A/B ratio: a = 1.10)

| | | Comparative Example 7 | Example 8 |
|---|---|---|---|
| Constant temperature keeping conditions | | Keeping was not performed | 850° C. × 5 h |
| Heat area [° C. × h.] | | 425 | 4675 |
| Bulk density [g/cm³] | | 4.430 | 4.440 |
| Relative dielectric constant | | 930 | 975 |
| $d_{31}$ [pm/V] | | 85 | 88 |
| tan δ [%] | | 2.0 | 1.5 |
| S4000 [ppm] | | 560 | 580 |
| c/a | | 1.0100 | 1.0102 |
| $T(\epsilon_{max})$ [° C.] | | 50 | 46 |
| Grain diameter distribution | Microscopic grains | 40% | 14% |
| | Intermediate grains | 60% | 1% |
| | Coarse grains | 0% | 85% |
| Maximum grain diameter [μm] | | Less than 15 | 90 |

TABLE 6

Effects of constant temperature keeping process and
polarization temperature (the amount of Bi to be substituted:
t = 0.0005, an A/B ratio: a = 1.01)

| | | Comparative Example 1 | Example 2 | Example 9 |
|---|---|---|---|---|
| Constant temperature keeping conditions | | Keeping was not performed | 850° C. × 5 h. | 850° C. × 5 h. |
| Heat area [° C. × h.] | | 425 | 4675 | 4675 |
| Polarization temperature [° C.] | | 25 | 25 | 65 |
| Bulk density [g/cm³] | | 4.432 | 4.496 | 4.496 |
| Relative dielectric constant | | 982 | 1141 | 1190 |
| $d_{31}$ [pm/V] | | 97 | 107 | 112 |
| tan δ [%] | | 1.1 | 0.8 | 0.9 |
| S4000 [ppm] | | 615 | 705 | 800 |
| c/a | | 1.0199 | 1.0207 | 1.0207 |
| $T(\epsilon_{max})$ [° C.] | | 44 | 30 | 30 |
| Grain diameter distribution | Microscopic grains | 55% | 17% | 17% |
| | Intermediate grains | 45% | 2% | 2% |
| | Coarse grains | 0% | 81% | 81% |
| Maximum grain diameter [μm] | | Less than 15 | 60 | 60 |

It is to be noted that the properties shown in Tables 1 to 6 are room temperature data. Moreover, the relative dielectric constant and the piezoelectric constant are values obtained after polarization. The grain diameters of the microscopic grains in the grain diameter distribution are less than 5 μm, the grain diameters of the intermediate grains are 5 μm or more and less than 15 μm, and the grain diameters of the coarse grains are 15 μm or more. The ratios of these grains were calculated in the share in terms of area.

As seen from the results shown in the tables, in a case where a firing curve (a time-temperature curve) included a constant temperature keeping process of keeping the sample at the constant temperature in a range of 800 to 900° C. (further preferably 840 to 860° C.) for the constant time during the heating process from room temperature to the firing temperature, the ratio of the microscopic grains having grain diameters less than 5 μm decreased, the ratio of the coarse grains having grain diameters of 15 μm or more increased, and electrical properties typified by the electric-field-induced strain S4000 were improved. The present composition system has characteristics that the ratio of the coarse grains having grain diameters of 15 μm or more increases, the ratio c/a obtained by diffraction angles which are middle point of full width at half maximum of diffraction line profiles accordingly increases, and the temperature $T(\epsilon_{max})$ at which the dielectric constant is maximum shifts to a low temperature side.

Moreover, when the heat area in the range of 800 to 900° C. during the heating process was in a range of 800 to 20000 [° C.×h.], the ratio of the coarse grains increased, and the effect of the improvement of the electrical properties was recognized. It is to be noted that even in a case where as shown in FIG. 3E, the heating rate in the firing curve was decreased so as to set the heat area in the range of 800 to 900° C. to a range of 800 to 20000 [° C.×h.] instead of performing the constant temperature keeping process in the range of 800 to 900° C. during the heating process, a similar effect was recognized, and the properties were improved. When this heat area was less than 800 [° C.×h.], the grains insufficiently grew, and the properties were not sufficiently improved. On the other hand, when the heat area was more than 20000 [° C.×h.], the coarse grains became excessively large, the hetero-phases therefore gathered in the grain boundary, and eventually the dielectric loss increased.

When the A/B ratio (the value of a in the composition formula of the calcined/crushed powder) was in a range of 1.00 to 1.10, the effect of the improvement of the properties was recognized.

On the constant temperature keeping conditions for improving the electrical properties, the ratio of the microscopic grains decreased, the ratio of the coarse grains increased, and the ratio c/a (tetragonality) increased. However, when the sintered body was crushed and the X-ray diffraction profile was measured, the ratio c/a of the crushed powder decreased regardless of the original microstructure of the sintered body. Moreover, when the composition of the sintered body was the same but the grain diameter distribution of the sintered body varied, the ratio c/a of the crushed powder had an equal value. Therefore, an internal stress was induced in the sintered bodies obtained by Examples 1 to 9. In consequence, tetragonal phase became a nearly stable crystal phase in a room temperature range, the ratio c/a increased and the electrical properties typified by the electric-field-induced strain were improved. However, when the maximum grain diameter of the coarse grains exceeded 100 μm, the properties deteriorated.

Next, a mechanism for decreasing the microscopic grains and increasing the coarse grains by the constant temperature keeping process will be described. In the constant temperature keeping process in the range of 800 to 900° C., the grain boundary phase is thinly and uniformly spread. In consequence, the grain growth is suppressed, that is, the energy of the grain growth is stored. When a metal element such as Mn is incorporated in the grain boundary phase, the melting point of the grain boundary phase lowers, and dissolution occurs at the firing temperature. At this time, the stored energy of the grain growth is released at once, and hence the coarse grains grow. The grains present in a spatially discontinuous surface or a pore part are not easily incorporated in the coarse grains, and hence the grains become the microscopic grains or the intermediate grains.

When the microstructure of the sintered body is constituted of the microscopic grains having grain diameters less than 5 μm, the intermediate grains having grain diameters of 5 μm or more and less than 15 μm and the coarse grains having grain diameters of 15 μm or more and 100 μm or less, high electrical properties (the relative dielectric constant, piezoelectric constant, dielectric loss and electric-field-induced strain) are obtained. This is considered to occur owing to the effect of the internal stress. As means for obtaining such a microstructure, the steps of (1) adding an auxiliary agent mainly including Mn, Cr, Fe, Co, Ni, Cu and Zn to the calcined/crushed powder constituted of the composition of (Li, Na, K, Bi)(Nb, Ta)O$_3$ and (2) inserting a constant temperature keeping process, a temperature is kept constantly at a predetermined temperature within in the range of 800 to 900° C., to the heating process in the firing curve are effective. According to the present method, S4000 having a value of 560 to 615 ppm can be increased to 705 ppm at maximum. Furthermore, when a high-temperature polarization treatment is performed, S4000 can be increased to 800 ppm.

The piezoelectric materials of the present invention has excellent electric-field-induced strain, and are preferable as piezoelectric elements for actuators, sensors or the like.

What is claimed is:

1. An (Li, Na, K, Bi)(Nb, Ta)O$_3$ based piezoelectric material containing Mn, wherein a surface microstructure of a sintered body of the (Li, Na, K, Bi) (Nb, Ta)O$_3$ based piezoelectric material is constituted of microscopic grains having grain diameters of less than 5 μm, intermediate grains having grain diameters of 5 μm or more and less than 15 μm, and coarse grains having grain diameters of 15 μm or more and 100 μm or less, and wherein the surface microstructure of the sintered both includes 10 to 60% of the microscopic grains and 1% or more of the coarse grains in share of grains in terms of area.

2. The (Li, Na, K, Bi)(Nb, Ta)O$_3$ based piezoelectric material according to claim 1, which is represented by the following formula:

$$\{Li_y(Na_{1-x}K_x)_{1-y}\}_{1-t}Bi_t]_a(Nb_{1-z}Ta_z)O_3,$$

wherein 1.00≦a≦1.10, 0.20≦x≦0.80, 0.02≦y≦0.20, 0.00≦z≦0.50, and 0.0000<t<0.0100.

3. The (Li, Na, K, Bi)(Nb, Ta)O$_3$ based piezoelectric material according to claim 1, which is represented by the following formula:

$$\{Li_y(Na_{1-x}K_x)_{1-y}\}_a(Nb_{1-z}Ta_z)O_3+Bi_2O_3,$$

wherein 1.00≦a≦1.10, 0.20≦x≦0.80, 0.02≦y≦0.20, 0.00≦z≦0.50, and wherein an amount of Bi$_2$O$_3$ added is larger than 0.00 mol % and smaller than 0.5 mol %.

4. The (Li, Na, K, Bi)(Nb, Ta)O$_3$ based piezoelectric material according to claim 1, wherein a ratio c/a obtained by diffraction angles which are middle points of full width at half maximum of diffraction line profiles is larger, and a temperature T($\in_{max}$) at which a dielectric constant is maximum shifts to a low temperature side, compared with a sintered body having the same constituent elements and the same composition ratio but which does not include the coarse grains having grain diameters of 15 μm or more and 100 μm or less.

5. The (Li, Na, K, Bi)(Nb, Ta)O$_3$ based piezoelectric material according to claim 2, wherein a ratio c/a obtained by diffraction angles which are middle points of full width at half maximum of diffraction line profiles is larger, and a temperature T($\in_{max}$) at which a dielectric constant is maximum shifts to a low temperature side, compared with a sintered body having the same constituent elements and the same composition ratio but which does not include the coarse grains having grain diameters of 15 μm or more and 100 μm or less.

6. The (Li, Na, K, Bi)(Nb, Ta)O$_3$ based piezoelectric material according to claim 3, wherein a ratio c/a obtained by diffraction angles which are middle points of full width at half maximum of diffraction line profiles is larger, and a temperature T($\in_{max}$) at which a dielectric constant is maximum shifts to a low temperature side, compared with a sintered body having the same constituent elements and the same composition ratio but which does not include the coarse grains having grain diameters of 15 μm or more and 100 μm or less.

7. The (Li, Na, K, Bi)(Nb, Ta)O$_3$ based piezoelectric material according to claim 1, which further contains at least one metal element selected from the group consisting of Cr, Fe, Co, Ni, Cu and Zn.

8. The (Li, Na, K, Bi)(Nb, Ta)O$_3$ based piezoelectric material according to claim 2, which further contains at least one metal element selected from the group consisting of Cr, Fe, Co, Ni, Cu and Zn.

9. The (Li, Na, K, Bi)(Nb, Ta)O$_3$ based piezoelectric material according to claim 3, which further contains at least one metal element selected from the group consisting of Cr, Fe, Co, Ni, Cu and Zn.

10. The (Li, Na, K, Bi)(Nb, Ta)O$_3$ based piezoelectric material according to claim 6, which further contains at least one metal element selected from the group consisting of Cr, Fe, Co, Ni, Cu and Zn.

* * * * *